United States Patent [19]

Newell et al.

[11] Patent Number: 4,980,687
[45] Date of Patent: Dec. 25, 1990

[54] DIGITAL DEMODULATOR

[75] Inventors: Gerald R. Newell, Alamo; Pradeep Bhardwaj, Concord, both of Calif.

[73] Assignee: Systron Donner, Concord, Calif.

[21] Appl. No.: 257,509

[22] Filed: Oct. 13, 1988

[51] Int. Cl.⁵ ............................................. H03M 1/60
[52] U.S. Cl. ..................... 341/157; 329/323; 375/53; 341/50
[58] Field of Search ............ 341/157, 155, 50; 329/323; 375/53

[56] References Cited

U.S. PATENT DOCUMENTS

| | | | |
|---|---|---|---|
| 3,887,768 | 6/1975 | Forney, Jr. et al. | 375/53 |
| 3,916,179 | 10/1975 | Cuzzo | 341/157 |
| 4,025,868 | 5/1977 | Miki et al. | 341/157 |
| 4,135,057 | 1/1979 | Bayless, Sr. et al. | 375/53 |
| 4,321,548 | 3/1982 | Jeenicke et al. | 341/157 |
| 4,435,697 | 3/1984 | Takahashi | 341/157 |
| 4,476,585 | 10/1984 | Reed | 329/323 |
| 4,488,119 | 12/1984 | Marshall | 329/323 |
| 4,499,426 | 2/1985 | Parker | 329/323 |
| 4,507,648 | 3/1985 | Conway et al. | 341/50 |
| 4,777,449 | 10/1988 | O'Connor | 329/323 |

*Primary Examiner*—William M. Shoop, Jr.
*Assistant Examiner*—Helen Kim
*Attorney, Agent, or Firm*—Flehr, Hohbach, Test, Albritton & Herbert

[57] ABSTRACT

An analog baseband signal modulates a reference-frequency carrier signal to provide a double-sideband, suppressed-carrier DSB-SC signal. The DSB-SC signal is converted in a voltage-to-frequency converter to a series of pulses, which are demodulated to produce a digitally formatted version of the baseband signal. A notch filter for rejecting an undesired analog signal includes a voltage-to-frequency converter and a selective feedback path which demodulates the undesired signal from a frequency-encoded domain back to the analog domain for a cancellation in a summer preceding the voltage-to-frequency converter.

19 Claims, 5 Drawing Sheets

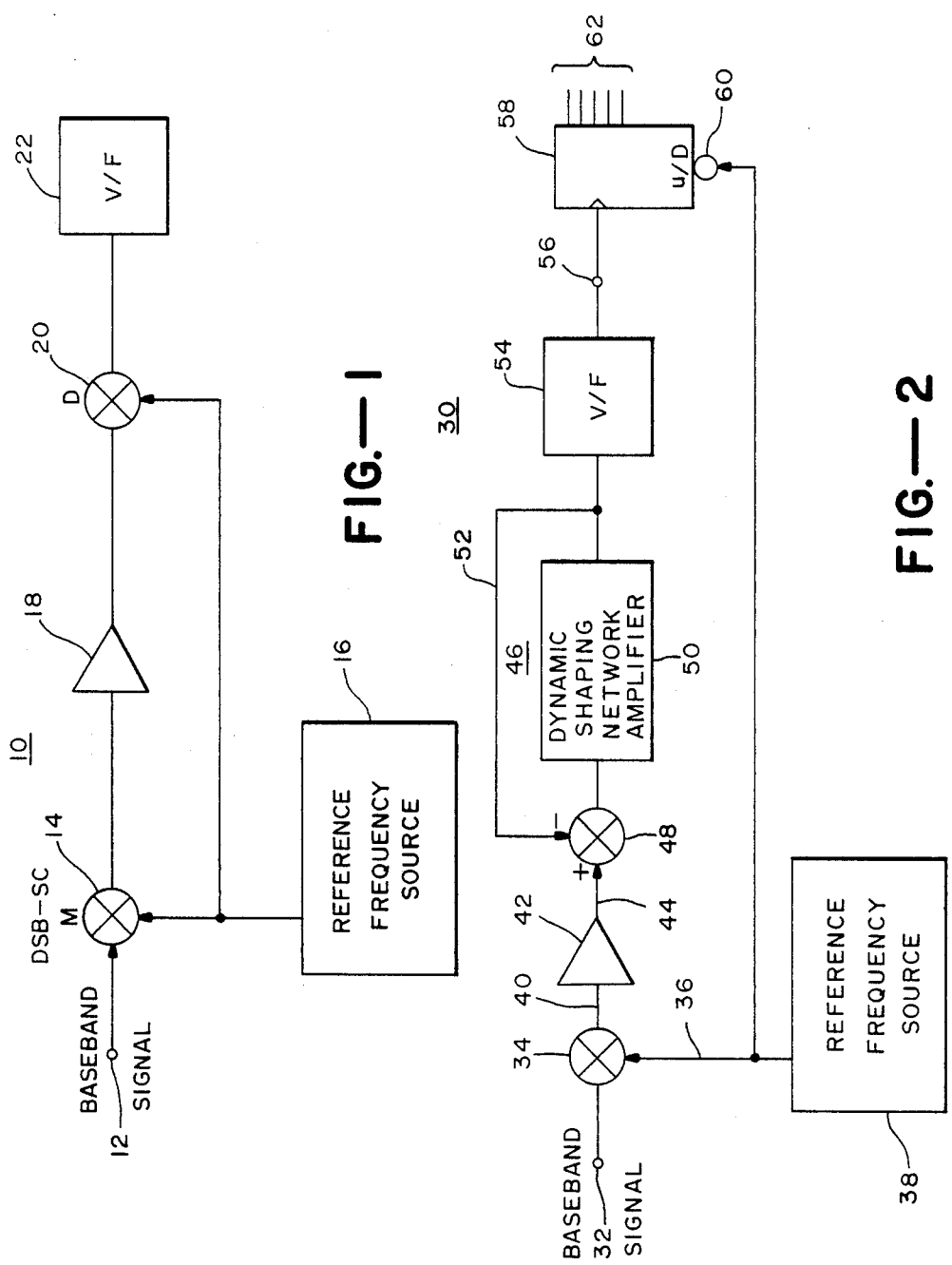
FIG.—1
FIG.—2

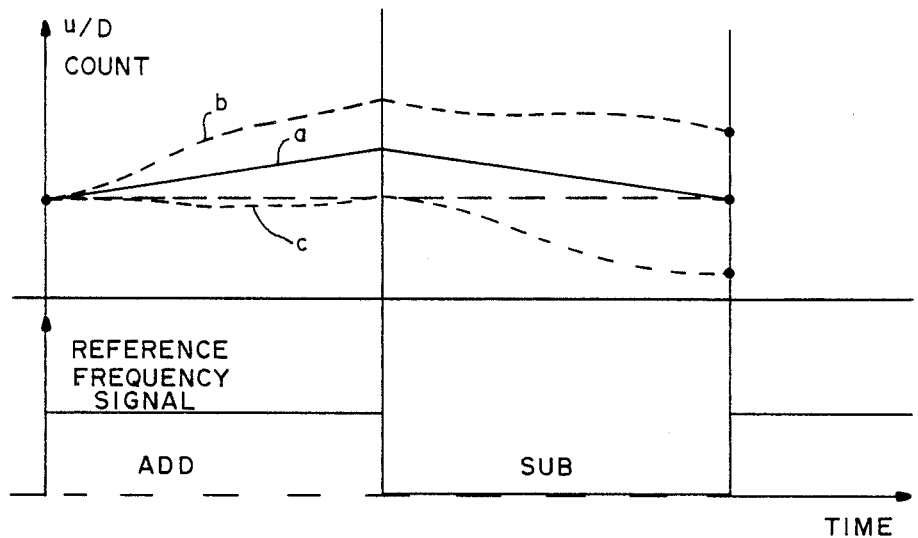
FIG.—3
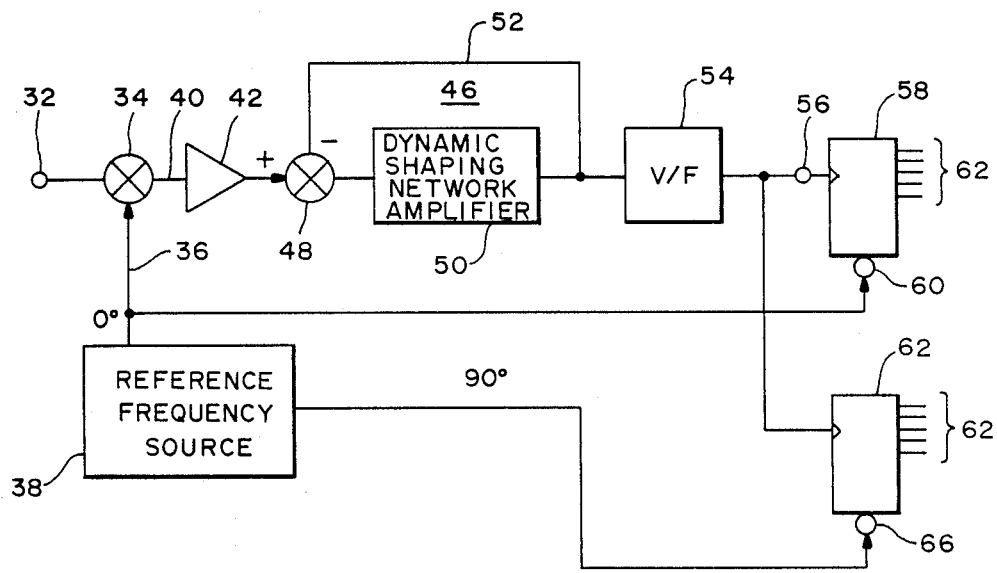
FIG.—4

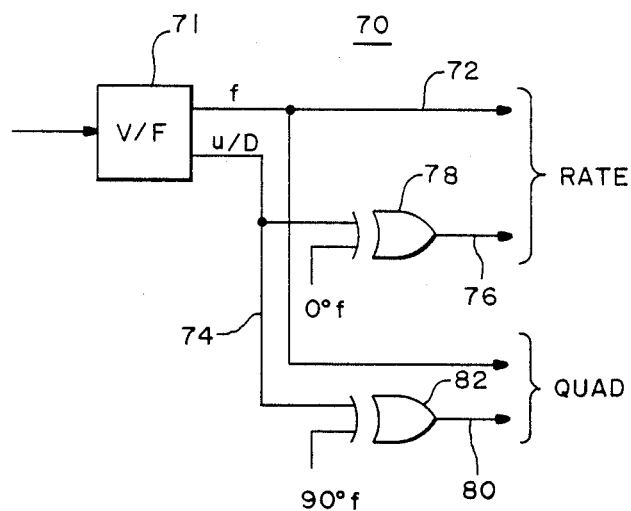
FIG.—5
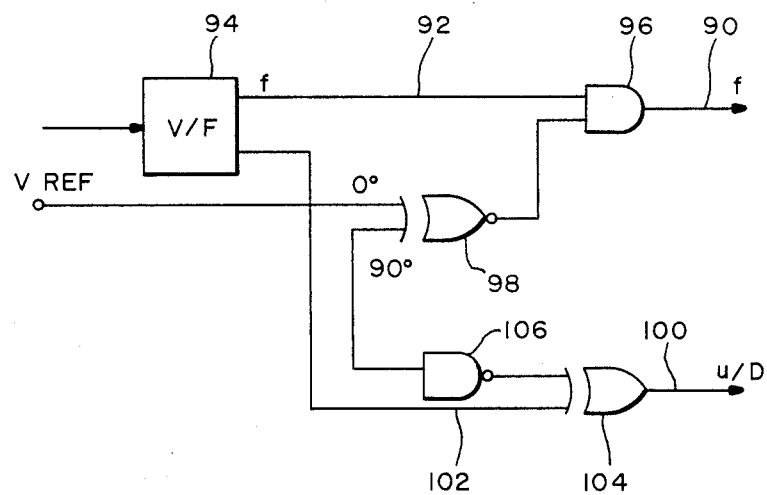
FIG.—6

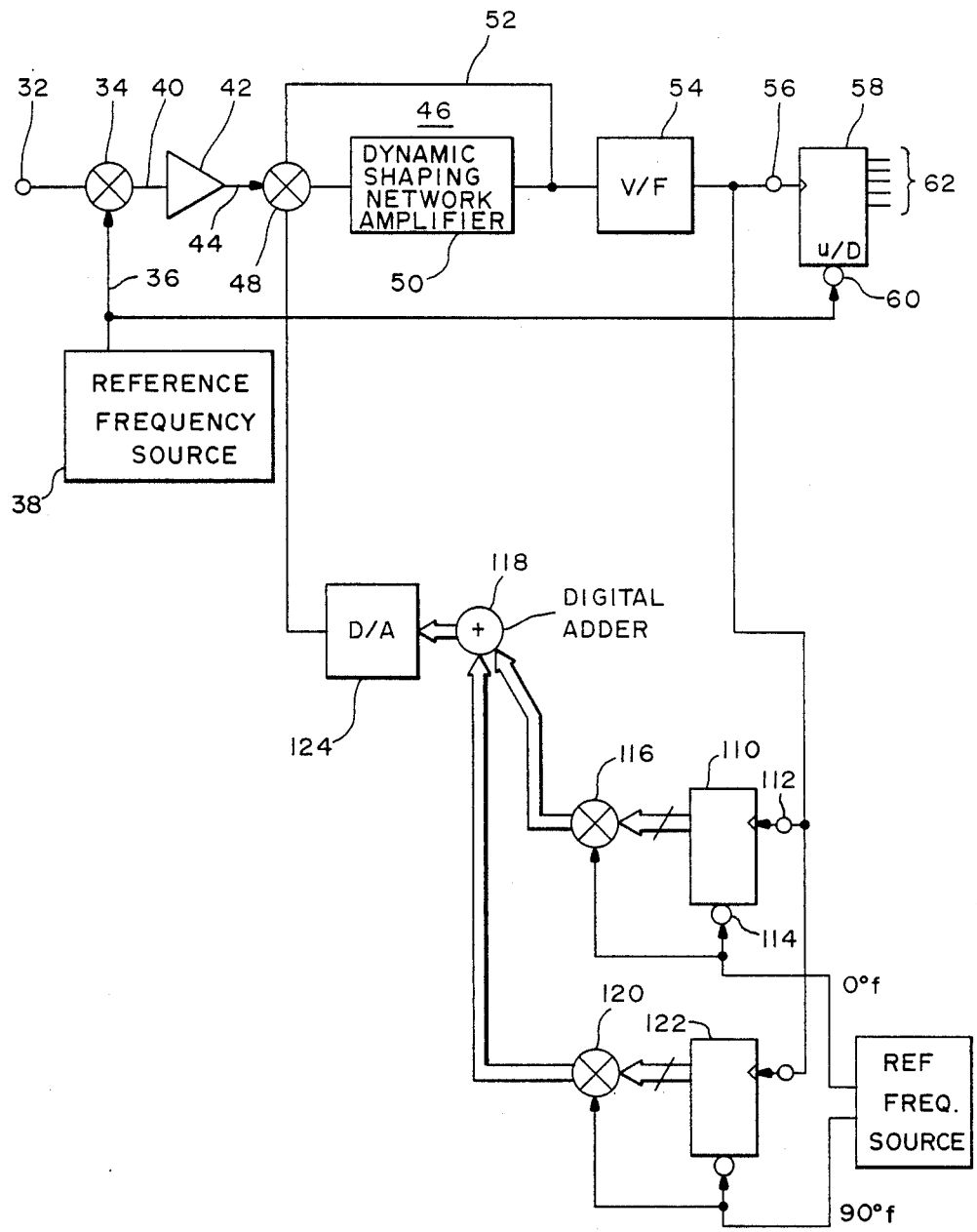
FIG.—7

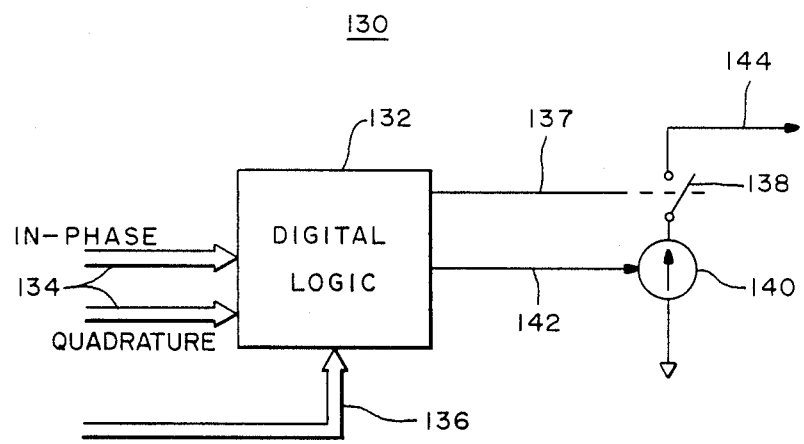
FIG.—8A
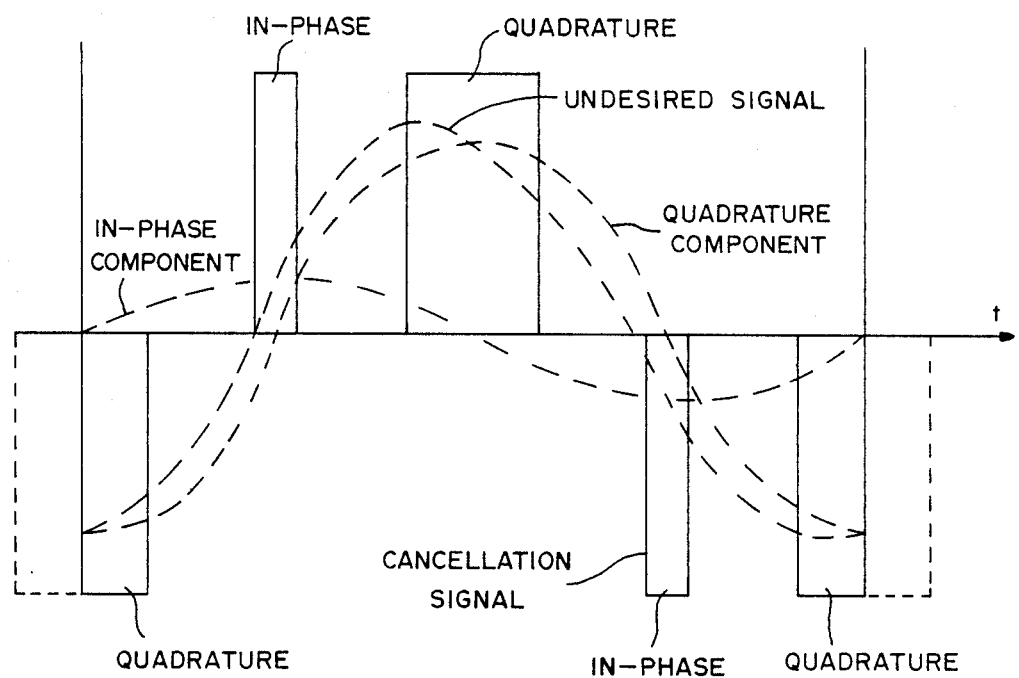
FIG.—8B

DIGITAL DEMODULATOR

BACKGROUND OF THE INVENTION

1. Field of the Invention

This invention relates to systems for processing signals and, more particularly, to systems for converting low-frequency baseband signals to digital formats.

2. Prior Art

In certain applications signals are produced which may vary over a range of a million to one, requiring signal resolutions of one part per million. For example, certain inertial navigation systems require such accuracy. For achieving a dynamic range of a million to one, a conventional parallel analog-to-digital circuit requiring 20 bits per sample would be extremely difficult to fabricate and keep in calibration with aging of components and over a range of temperatures. For these applications, a voltage-to-frequency converter is normally used which generates an output signal having a frequency proportional to the voltage level of an input baseband signal. By counting the frequency of the signal produced by the voltage-to-frequency converter over a finite time interval, a quantity representing the integral of the input baseband signal can be computed. The input baseband signals to be measured in such systems have a frequency range which extends down to dc. Shifts in dc level in the circuits of a system are caused, for example, by temperature changes or by subjection to external radiation. Consequently, any shifts in the dc level within any circuit handling a baseband signal limits the voltage accuracy of a system.

SUMMARY OF THE INVENTION

It is therefore an object of the invention to provide a system for representing a baseband signal which has a large dynamic range.

It is another object of the invention to provide a system for digitally representing a baseband signal.

It is another object of the invention to provide a system for representing a baseband signal which is immune to shifts in dc levels within said system.

In accordance with these and other objects of the invention a system is provided for digitally demodulating a DSB-SC signal to obtain a digital version of a baseband signal. In some applications the baseband signal is a low-frequency analog signal. The system includes a voltage-to-frequency converter which encodes the voltage levels of the DSB-SC signal as the frequency of a series of output pulses. The invention contemplates directly demodulating the frequency-encoded DSB-SC output signal of the voltage-to-frequency converter to obtain the baseband signal in a digital format. The invention is operable to demodulate both in-phase and quadrature components of the baseband signal.

The voltage-to-frequency converter can encode the DSB-SC signal in two formats. One is a "unipolar" format in which the frequency of the output signal is proportional to the voltage level of the DSB-SC signal, perhaps with some other frequency. The other is a "bipolar" format in which the DSB-SC signal is encoded as two component signals. The two-component signals include a frequency-component signal which is proportional to the absolute value of the difference between the DSB-SC signal and a reference voltage level. The two component signals also include an up/down component which digitally represents whether the DSB-SC signal is greater than or less than the reference voltage level.

To synchronously demodulate the unipolar-formatted output signal of the voltage-to-frequency converter, the signal is fed to an up/down counter. The counter has an up/down direction control terminal to which is fed the reference-carrier signal of the DSB-SC signal. This synchronously detects the in-phase baseband signal and provides a digital word representing the integral of the baseband signal. The counter integrates, and reversal of the up/down count in synchronism with the reference-carrier synchronously demodulates the DSB-SC signal.

To synchronously demodulate a bipolar-formatted output signal of the voltage-to-frequency converter, the up/down component signal is EXCLUSIVE-ORed with the reference-carrier to obtain an in-phase sign bit signal. This is optionally integrated in an up/down counter by counting the frequency component up or down as indicated by the sign bit signal.

The system described above is also used to digitally represent an analog baseband signal in a digital format.

A notch filter for rejecting an undesired input signal is provided by processing the undesired signal through the voltage-to-frequency converter to create a frequency-encoded representation of the undesired signal. That signal is then processed and selectively fedback through a feedback path to a summing junction preceding the voltage-to-frequency converter for cancellation of the undesired input signal. The feedback path includes circuits for converting the frequency-formatted undesired signal back to the same format as the undesired input signal. The conversion circuits includes a demodulator and selective filter for selectively converting the frequency-formatted signal to a digitally-formatted signal as described in connection with the demodulator described above. The demodulation and selective filtering can be accomplished using an up/down counter as described above.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 shows a prior art system for amplifying a DSB-SC signal modulated by a very low frequency baseband signal.

FIG. 2 shows a system according to the invention for digitally demodulating an in-phase component of a baseband signal from a frequency-encoded version of DSB-SC signal to provide a digitally formatted version of the integral of the in-phase component of the baseband signal.

FIG. 3 shows waveform drawings representing the up/down counter output count which changes direction under the control of a square-wave reference-frequency signal.

FIG. 4 shows the system of FIG. 2 which further includes a system according to the invention for digitally demodulating the quadrature component of a baseband signal from a frequency-encoded version of DSB-SC signal to provide a digitally formatted version of the integral of the quadrature component of the baseband signal.

FIG. 5 shows a system according to the invention for providing a frequency-encoded signal which is represented by a frequency component and a sign bit component.

FIG. 6 shows a system according to the invention for obtaining a frequency encoded digital representation of both the in-phase and quadrature components of a baseband signal.

FIG. 7 shows a system according to the invention which digitally demodulates a baseband signal and which also provides a notch filter for an undesired input signal.

FIG. 8A shows a system for generating a DSB-SC signal from an input digital baseband signal.

FIG. 8B shows a DSB-SC baseband signal waveform produced by the system of FIG. 7A.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Referring now to the drawings, FIG. 1 shows a prior art system 10 for processing a low-level baseband signal connected to an input terminal 12 of a double-sideband, suppressed-carrier DSB-SC modulator 14. The baseband signal has a frequency range of, for example, dc to several hundred Hertz. The modulator 14 is, for example, a balanced modulator which multiplies the baseband signal by a reference-carrier signal from a reference-carrier frequency source 16 to produce a low-level DSB-SC output signal at its output terminal. The DSB-SC signal is processed by being amplified and filtered, as required, in an amplifier 18, which is a bandpass amplifier having the reference-carrier frequency as its center frequency. The amplified DSB-SC signal is then converted back down to baseband by being synchronously detected in a demodulator 20 with a reference-frequency signal from the source 16. The demodulator baseband output signal is then direct-coupled to an analog-to-digital converter, such as a voltage-to-frequency converter 22. Voltage-to-frequency converters are often used where high of the voltage-to-frequency converter 22 is proportional to the voltage level of the baseband signal. Because the baseband signal ranges from dc to several hundred Hertz, it is required to be dc-coupled to the voltage-to-frequency converter, which is susceptible to dc-voltage level drifts caused by aging, temperature, and irradiation by high energy. For applications requiring accuracies on the order of parts in one million, a system using dc coupling requires compensation and periodic calibration and such a system would be unusable after being irradiated with high energy.

FIG. 2 shows a system 30 according to the invention which avoids demodulating the DSB-SC signal prior to conversion to a digital format. A baseband signal is connected to an input terminal 32 of a double-sideband, suppressed-carrier DSB-SC modulator 34. The baseband signal may typically be an analog signal having a frequency range of, for example, dc to several hundred Hertz and may require an accuracy of better than a few parts per million. The modulator 34 is, for example, a balanced modulator which linearly multiplies the baseband signal by a reference-carrier signal provided on signal line 36 from a reference-carrier frequency source 38. This produces a low-level DSB-SC output signal on the signal line 40 connected to the output terminal of the modulator 34. Alternatively, in some applications a DSB-SC signal similar to that on signal line 40 and a reference-carrier signal similar to that provided on signal line 36 are derived in an external circuit and provided as input signals to the system. The DSB-SC signal on line 40 is amplified in an amplifier 42 and then coupled on a signal line 44 to a linear feedback-amplifier subsystem 46. The amplifier sub-system 46 includes a summer 48 which has signal line 44 coupled to the positive input terminal thereof. The summer output is coupled to the input of a dynamic shaping network amplifier 50 which amplifies and filters the DSB-SC signal. The output of the network is then fed back on a feedback signal line 52 to the negative input terminal of the summer 48 to cancel any distortion introduced by the shaping network amplifier 50. The feedback insures that the amplification and filtering are linear processes.

The amplified DSB-SC signal at the output of the amplifier 50 is not converted back down to the baseband analog domain. The DSB-SC signal is AC coupled to the input of a voltage-to-frequency converter 54, which provides an output signal comprising, for example, a series of digital pulses having a repetition rate, or frequency, which is proportional to the voltage level of the DSB-SC signal. Because the voltage-to-frequency converter is AC coupled, its input circuitry is not susceptible to dc-voltage level drifts caused by aging, temperature, and irradiation by high energy. AC coupling is well suited for applications requiring accuracies better than a few parts in one million.

The output signal pulses of the voltage-to-frequency converter 54 are applied to the input signal terminal 56 of an up/down frequency counter 58. The counter functions as a digital accumulator, or integrator, of the signal pulses from the voltage-to-frequency converter. Since the various frequencies represent the various voltage levels of the DSB-SC signal, the output pulse stream of the V/F converter 54 represents the DSB-SC signal encoded in a "frequency" format, and the output reading of the counter 58 represents the integral of the DSB-SC signal as a digital or binary number.

A reference-frequency signal from the source 38 is applied to the up/down control terminal 60 of the counter 58 to change the direction of the count depending on the polarity of the reference-frequency signal. For an up-count, the input frequency is added to the counter output total; and for a down-count, the input frequency is subtracted from the counter output total. If the reference-frequency signal applied to the up/down control terminal is a square wave with a 50% duty cycle, the reference frequency signal, in effect, alternately multiplies the counter output reading by plus one and by minus one. Multiplication of a DSB-SC signal in this manner by its carrier signal, i.e., the reference-frequency signal, synchronously demodulates the DSB-SC signal to produce the originally encoded baseband signal. Consequently, the output of the up/down counter 58 on data lines 62 is a digital word representing the integral of the baseband signal to an accuracy of one part in a million.

Typical numerical values for a system are: a baseband signal having a frequency range of dc to a few hundred Hz, a reference-frequency signal of 10 kHz., and a voltage-to-frequency full-scale range of zero to 10MHz. For these exemplary values, it should be appreciated that a DSB-SC output signal frequency ranges over 10kHz plus or minus a few hundred Hz. and that the corresponding output pulses from a voltage-to-frequency converter have a frequency range of zero to 10 Mhz.

FIG. 3 shows the output count of the up/down counter 58 as a function of time with a square-wave reference-frequency signal applied to the up/down control terminal 60 of the up/down counter 58. Assume that the voltage-to-frequency converter provides output signal pulses at a 5 MHz. rate when no DSB-SC signal is present at the input of the voltage-to-frequency converter 54. The solid line "a" represents the counter output for this no-signal condition. During the ADD portion of the reference-frequency signal, counts are added to the counter total, while during the SUBTRACT portion of the reference-frequency signal, counts are subtracted from the counter total. For the no-signal condition, the counter total as represented by the solid line "a" returns to the same number at the end of each reference-signal cycle. The dotted line "b" represents the counter output for the condition where the DSB-SC signal is in-phase with respect to the reference signal, and is super imposed on the no-signal level. In this case, the up-count during the ADD portion of the reference signal exceeds the down-count during the SUBTRACT portion of the reference-frequency signal, leaving a net positive count in the counter at the end of the reference-signal cycle. Similarly, the dotted line "c" represents the counter output for the condition where the DSB-SC signal is out of phase with respect to the reference signal. In this case, the up-count during the ADD portion of the reference signal is less than the down-count during the SUBTRACT portion of the reference-frequency signal, leaving a smaller net count in the counter at the end of the reference-signal cycle. Note that the counter output represents the integral of the baseband signal as a function of time.

FIG. 4 shows the system of FIG. 2 which further includes an up/down counter 62 according to the invention for digitally demodulating the quadrature component of a baseband signal from a frequency-encoded version of DSB-SC signal to provide a digitally formatted version of the integral of the quadrature component of the baseband signal at the output data lines 64. For this quadrature-signal demodulation, a quadrature reference-frequency signal, at 90 degrees from the in-phase reference-frequency signal, is provided from the source 38 to the up/down control terminal 66 of the up/down counter 64. Counter 62 functions in the same manner as counter 56 to produce a digitally formatted version of the integral of the quadrature-phase component of the baseband signal.

FIG. 5 shows an alternative system 70 for demodulating a DSB-SC signal when a voltage-to-frequency converter 71 encodes the voltage levels of said DSB-SC signal into two component signals. In the "bi-polar" representation, one component signal, provided on signal line 72, is a frequency-component signal, which is proportional to the absolute value of the difference between the DSB-SC voltage level and a reference voltage level, such as, for example, the DSB-SC no-signal level. The other component, which is provided on signal line 74 is an up/down signal component, which digitally represents whether the voltage level of the DSB-SC signal is greater than or less than the reference voltage level. This system 70 for demodulating a DSB-SC signal provides the frequency-component signal as an output signal on line 72. Multiplying the up/down signal with the in-phase reference carrier signal to provide an in-phase, sign-bit output signal on signal line 76 is performed with an EXCLUSIVE-OR gate 78, which has the up/down signal and the in-phase reference-carrier signal as input signals and which provides the in-phase sign-bit of the in-phase frequency-component signal. For obtaining a quadrature sign-bit on signal line 80, an EXCLUSIVE-OR gate 82 is provided which has the up/down signal and the quadrature reference-carrier signal as input signals.

FIG. 6 shows a system for obtaining a "bi-polar" two-component set of signals for representing demodulation of an entire baseband signal For the frequency representation on signal line 90, the output frequency component on signal line 92 of the voltage-to-frequency converter 94 is multiplied in an AND gate 96 by the output of an EXCLUSIVE-NOR gate, with the inputs to the EXCLUSIVE-NOR GATE 98 being the in-phase component and the quadrature component of the frequency-reference signal. For the sign-bit, or U/D, representation on signal line 90, the output sign-bit component on signal line 102 of the voltage-to-frequency converter 94 is added in an EXCLUSIVE-OR gate 104 by the output of a NAND gate 106, with the inputs to the NAND gate 196 being the in-phase component and the quadrature component of the frequency-reference signal.

FIG. 7 shows a notch filter for rejecting an undesired input signal, which is, for example, a 60 Hz. baseband signal or some other signal in either the baseband or the frequency band of the DSB-SC signal which is at a sufficient level to interfere with the operation of the system 30 shown in FIG. 2. This notch filter utilizes the summer 48, the voltage-to-frequency converter 54, and a feedback path coupled between the output of the voltage-to-frequency converter 54 and another negative input terminal of the summer 48. The undesired signal is added to the desired signal to form a composite signal which is passed to the voltage-to-frequency converter 54 where it is converted to a series of frequency-encoded pulses. The feedback path generically includes a means for selectively converting the frequency-encoded signal which represents the undesired signal to a cancellation signal which has the same format as the undesired signal, for example, a baseband analog signal. The cancellation signal is then coupled to other, or second, negative input terminal of said summer to cancel the undesired input signal. In effect, an approximately equal and opposite signal, called the cancellation signal, is developed in the feedback path to cancel the original undesired input signal. In the embodiment of the selective feedback path shown in FIG. 7 the up/down counter 110 has the output of the voltage-to-frequency converter 54 fed to its signal input terminal, while a carrier signal synchronous with the undesired signal is coupled to the up/down control terminal 114 of the counter 112. This arrangement provides two functions: one is to demodulate the frequency pulses to a digitally formatted baseband signal at the output of the counter and the other is to integrate that signal. The integration of the undesired signal's frequency function performed at baseband is a filtering function with very high Q at the frequency, that is, a very narrow-band filter having its frequency pass-band centered on the frequency of the undesired signal. To convert the digital words at the output of the up/down counter 110 back to the analog signal format of the undesired signal, the output signal of the up/down counter 110 is synchronously multiplied in a digital multiplier 116 by the carrier signal synchronous with the undesired signal. This signal is then summed in a digital adder 118 with a quadrature component of the undesired signal obtained from a similar arrangement using a second digital multiplier 120 and a second up/down counter 122, both fed with a quadrature undesired signal carrier signal. Thus, the integral of either or both the in-phase and quadrature components of the undesired signal are generated. Finally, the digital signal representing the cancellation signal for the undesired signal is converted to an analog format in the digital-to-analog converter 124, which may provide a coarse conversion to not completely cancel the undesired signal but rather reduce it to an acceptable, relatively low level.

The system of FIG. 7 can be used to provide analog output signals filtered with high frequency selectivity by using the output of amplifier subsystem 46 as the signal output, and may be applied to (SB-SC signals (as shown) or baseband signals directly.

FIG. 8A shows a form of a digital-to-analog system for precisely generating a cancellation signal for an undesired signal as discussed in connection with FIG. 7. When the desired signal must be recovered with great accuracy, it is desirable that the undesired signal be cancelled with some precision. This is particularly important regarding phase accuracy of the cancellation signal so that the cancellation signal has precise phase accuracy and does not crosstalk into the desired signal channel.

FIG. 8A shows a precision, pulse-width modulated digital-to-analog converter system 130 which includes a digital logic module 132. One set of input signals 134 to the module 132 includes a series of output digital words taken from the output of the up/down counters 110 and 112 of FIG. 7. Another set of input signals 136 are clocking signals derived from the in-phase desired carrier and the quadrature reference-frequency signals of the signal. The two sets of signals are processed in the logic module 132 to provide two signals: a pulse width control signal on signal line 137 which controls a switch 138 which in turn controls the width of current pulses from a current source 140. In the preferred embodiment shown, the polarity of the current source 140 is also controlled with an up/down-current signal on signal line 142.

FIG. 8B shows an output waveform present on signal line 144 which serves as a cancellation signal to be fed into, for example, the summer of FIG. 7. The in-phase and the quadrature components of the undesired signal are shown for reference. Note that the in-phase component signal has lower amplitude than the quadrature component. The pulse-widths and polarity signals generated by the digital logic 132 are precisely controlled to generate a signal which has a fundamental component precisely in phase and with the same magnitude as the desired cancellation signal represented in digital form in counters 110 and 122. Note that the D/A converter system 130 takes baseband in-phase and quadrature signal components and with reference signals 136 generates a DSB-SC signal, performing the two functions of D/A conversion and modulation.

Types of feedback other than integral, such as proportional feedback, can be utilized separately or in combination to develop the desired filtering characteristics by those skilled in the art.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A system for digitally demodulating a baseband signal from a modulated input signal, said modulated input signal formed by modulating a reference-carrier signal with said baseband signal, comprising:
   voltage-to-frequency converter means for encoding the voltage levels of said modulated input signal as the frequency of the output signal of said voltage-to-frequency converter means;
   means for demodulating the output signal of said voltage-to-frequency converter means to obtain a digitally formatted version of the in-phase component of said baseband signal.

2. The system of claim 1 including means for demodulating the output signal of said voltage-to-frequency converter means to obtain a digitally formatted version of the quadrature-phase component of said baseband signal.

3. The system of claim 1 wherein the voltage-to-frequency converter means encodes the voltage levels of said input signal into a frequency signal proportional to the voltage levels of said input signal; and
   wherein the means for demodulating includes:
   means for counting the frequency of the output signal of said voltage-to-frequency converter means;
   means for reversing the count of said counting means in synchronism with the reference-carrier signal of said input signal to thereby synchronously demodulate said input signal.

4. The system of claim 3 wherein the means for counting includes an up/down control terminal having the reference-carrier signal of said input signal connected thereto.

5. The system of claim 1 wherein the voltage-to-frequency converter means encodes the voltage levels of said modulated input signal into two component signals: one component being a frequency-component signal, which is proportional to the absolute value of the difference between the voltage level of said modulated input signal and a reference voltage level, and the other component being an up/down component, which digitally represents whether the voltage level of said modulated input signal is greater than or less than said reference voltage level;
   wherein the means for demodulating provides the frequency-component signal as an output signal and includes means for multiplying the up/down signal with the reference carrier signal to provide a sign bit output signal.

6. The system of claim 5 wherein the means for multiplying the up/down signal includes an EXCLUSIVE-OR gate having the up/down signal and the reference-carrier signal as input signals to obtain an in-phase sign bit of said frequency-component signal.

7. The system of claim 5 wherein the means for multiplying the up/down signal includes an EXCLUSIVE-OR gate having a up/down signal and the quadrature reference-carrier signal as input signals to obtain a quadraturephase sign bit of said frequency-component signal.

8. A system for digitally representing a baseband signal, comprising:
a source of a reference-frequency signal;
a DSB-SC modulator in which said baseband signal modulates said reference-frequency signal to produce a DSB-SC signal at an output terminal thereof;
a voltage-to-frequency converter having an input terminal coupled to the output terminal of the DSB-SC modulator, said voltage-to-frequency converter having an output terminal at which is provided an output signal, the frequency of said output signal being proportion to the voltage level of said DSB-SC signal;
a frequency-to-digital converter including an up-down frequency counter having a frequency input terminal coupled to the output terminal of said voltage-to-frequency converter and having an up-down control terminal to which is coupled the reference-frequency signal for switching the counting direction of said up-down frequency counter in synchronism with said reference-frequency signal to thereby demodulate the output signal of said voltage-to-frequency converter and provide a digital output signal representative of the integral of the baseband signal.

9. The system of claim 8 wherein said baseband signal is an analog signal.

10. The system of claim 8 including signal amplifier means, coupled between the output of said DSB-SC modulator and the input of said voltage-to-frequency converter, for amplifying the DSB-SC signal.

11. The system of claim 8 wherein the reference-frequency signal coupled to the up-down control terminal for switching the counting direction of said up-down frequency counter is a square-wave having a 50% duty cycle.

12. A filter for rejecting an undesired input signal, comprising:
difference means for taking the difference between signals present at a first input terminal and a second input terminal thereof and providing an output difference signal at an output terminal thereof, said difference means having the undesired input signal coupled to the first input terminal of said difference means;
a voltage-to-frequency converter having an input terminal coupled to the output cf said difference means and having an output terminal at which is provided a frequency output signal corresponding to the voltage level at the input terminal thereof;
a feedback path coupled between said output terminal of said voltage-to-frequency converter and said second input terminal of said difference means;
said feedback path including means for selectively converting the frequency output signal representative of said undesired signal to a cancellation signal having the format of said undesired signal, said cancellation signal being coupled to the second input terminal of said difference means to thereby cancel the undesired input signal.

13. The filter of claim 12 wherein the selective conversion means in said feedback path includes:
means for demodulating the output frequency signal of said voltage-to-frequency converter to a digitally formatted signal;
means for filtering said digitally formatted signal to obtain said cancellation signal in a digital format;
means for converting said digitally formatted cancellation signal to the format of the undesired signal.

14. The filter of claim 13 wherein said means for filtering includes means for integrating said digitally formatted signal.

15. The filter of claim 14 wherein said means for integrating includes means for counting the frequency of said output frequency signal.

16. The filter of claim 13 wherein said means for converting includes a digital-to-analog converter.

17. A digital-to-analog converter system for modulating a digital representation of an input baseband signal onto an input frequency-and-phase reference signal having frequency and phase information, comprising:
digital means for generating a digital signal for pulse-width control; and
means for converting said digital signal to an analog format such that the fundamental harmonic component of the output analog signal has substantially the same frequency, phase, and magnitude as represented by the digital signal for pulse-width control and by the frequency-and-phase reference signal.

18. The system of claim 17 wherein the means for converting the digital signal to an analog format includes a controlled current source.

19. The system of claim 18 including digital means for generating an up/down control signal which reverses the polarity of the controlled current source.

* * * * *